United States Patent [19]

Huang et al.

[11] 4,246,535

[45] Jan. 20, 1981

[54] DESIGN METHOD FOR LINEAR AMPLIFIER

[75] Inventors: Ho-Chung Huang, Princeton Jct.; Franco N. Sechi, Lawrenceville, both of N.J.

[73] Assignee: RCA Corporation, New York, N.Y.

[21] Appl. No.: 55,313

[22] Filed: Jul. 6, 1979

[51] Int. Cl.³ .................................. G01R 27/00
[52] U.S. Cl. .................................. 324/57 R; 364/488
[58] Field of Search ............ 324/57 R, 57 DE, 57 SS, 324/158 T, 73 R; 364/488, 489, 490, 491

[56] References Cited

PUBLICATIONS

Trudel, J. D.; "Magic: A Computer . . . ", Electronics, Apr. 4, 1974; pp. 138–141.
"Optimal Design . . . ", IEEE Trans. on Microwave Theory and Techniques, vol. MTT-14, pp. 696–698.

*Primary Examiner*—Ernest F. Karlsen
*Attorney, Agent, or Firm*—Samuel Cohen; Robert L. Troike; Raymond E. Smiley

[57] ABSTRACT

A method of designing a linear rf amplifier comprising an output load impedance and an active device including the steps of (a) applying DC bias to the device, (b) applying two different frequency signals of an amplitude C, and (c) changing the value of the load impedance and recording the impedance value and associated C/I ratio for each impedance value (C/I being the ratio of amplitude C and amplitude I—the amplitude of an intermodulation product frequency). The last step (c) is repeated for a plurality of output levels. The above is repeated for a plurality of input power levels. The next step is selecting from the recorded information the impedance values corresponding to the maximum C/I ratio and recording the impedance values and corresponding C/I ratios, input power levels and output power levels. Then, choosing a desired C/I ratio from those recorded in the previous step and selecting the impedance value corresponding to the maximum output power level.

4 Claims, 5 Drawing Figures

DESIGN METHOD FOR LINEAR AMPLIFIER

This invention relates to a method of design of a linear amplifier and more particularly to the method of design of a linear radio frequency (RF) amplifier.

Many types of devices are known to be used as amplifiers. These include three terminal devices such as the field effect transistor (FET) and the bipolar transistor and, for use at microwave frequencies, also include various two terminal negative resistance type devices such as the impatt diode, the trapatt diode, the tunnel diode and the transferred electron device.

An amplifier consists of a three terminal device or a two terminal device and circulator in combination with proper bias voltages and an appropriate input and output load matched to the device. Depending on the nature of the amplifying device and the frequency being amplified, different design approaches are utilized to determine the DC bias supply values, output load values and input power values consistent with a desired efficiency or output power and output signal linearity. Particularly at microwave frequencies and to some extent at lower frequencies the design of the DC bias supply and value of output load is accomplished by the "cut and try" method. Such a method does not, in the absence of pure luck, lead to an amplifier which has both high power output or high efficiency and high linearity at a desired operating frequency or over a desired spectrum of frequencies.

In accordance with the invention the method of determining, for an active device arranged as an amplifier with an output impedance circuit, the optimum output load impedance value and optimum input power for an amplifier having a predetermined linearity and maximum achievable efficiency comprises the steps of:

a. providing a DC bias to cause the device to amplify;

b. applying to the input of the device two different frequency signals within the bandwidth of the amplifier at a given input power level for causing the device to produce at its output terminal signals at the two different frequencies at an amplitude C and at least one other frequency of amplitude I which is an intermodulation distortion product frequency, where the ratio C/I is a measure of amplifier linearity;

c. changing the value of the output impedance to produce a family of impedance values which cause the amplifier to have a preselected output power and recording the output power, impedance values and associated C/I ratio for each impedance value;

d. repeating step (c) at a plurality of output powers;

e. repeating steps (b), (c) and (d) at a plurality of different input powers;

f. from recorded test data the next step is selecting for each output power level the maximum C/I ratio and recording the selected C/I level, associated input power level, associated output power level and associated impedance value; and g. choosing a desired C/I value from among those recorded in the previous step (f) which corresponds to a desired linearity and for the maximum output power at that linearity select the input power and impedance value. The impedance value thus selected is the value of the load impedance which, when said corresponding input power value is applied to the active device, provides the maximum efficiency directly related to output power for the desired C/I at the given bias value and at the given center frequency.

There are a number of preferred embodiments of the present invention. The preferred embodiment chosen by one in practicing the invention will depend on the types of test and measurement equipment available. When sophisticated test equipment including computers are available, the testing may be highly automated. With an intermediate level of test equipment available, parts of the test may be automated and the rest may consist of graphical presentation from which the optimum impedance and input power may be obtained graphically. Thirdly, although not normally recommended, a manual determination of impedance may be made.

Figure 1:
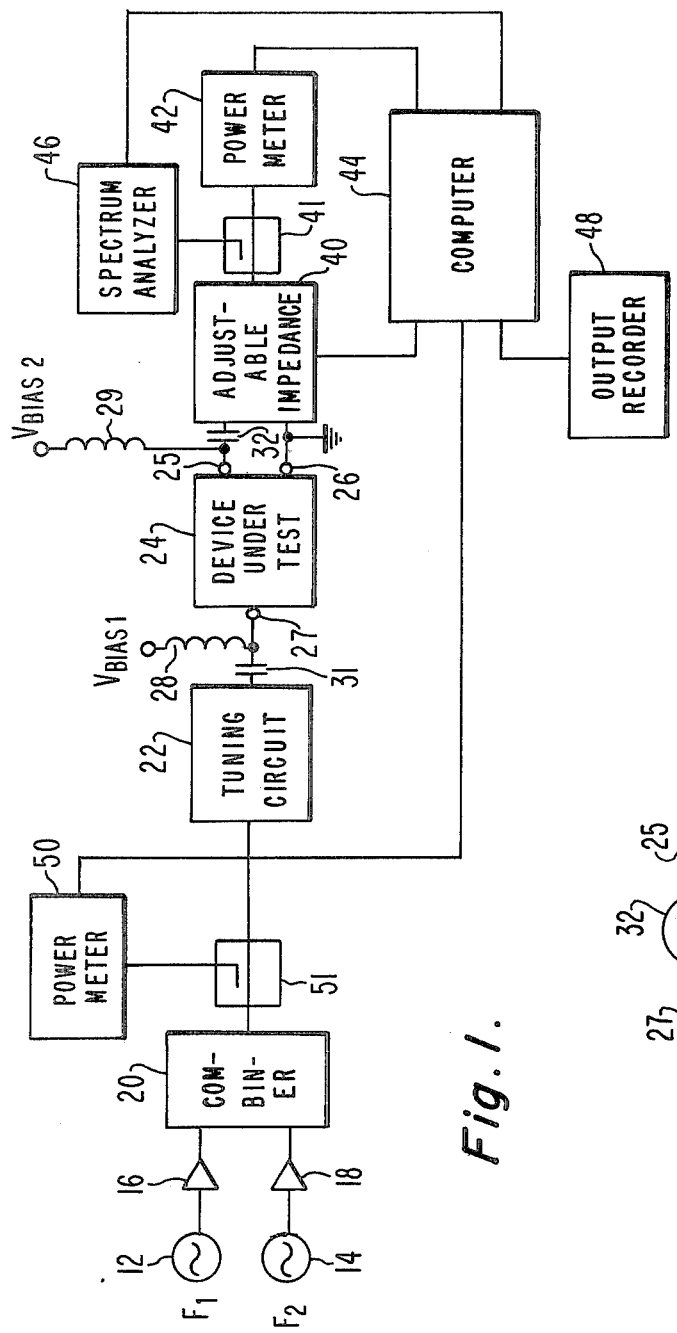
FIG. 1 is a test setup for applying signals to and taking measurements of an active device to be utilized in a linear amplifier circuit.

A typical test setup is illustrated in FIG. 1 for use in optimizing a field effect transistor amplifier as an active device used at microwave frequencies. Similar circuits will be utilized at other frequencies and with other types of active devices. First and second frequency generators 12 and 14 respectively are coupled to suitable amplifiers 16 and 18 respectively. The amplifiers are coupled to a combiner 20 which combines the frequencies produced by generators 12 and 14. Combiner 20 is coupled to a tuning circuit 22 which is coupled to a device under test 24 (e.g., an FET). Tuning circuit 22 merely is an input impedance matching circuit for matching the impedance at combiner 20 to the optimum impedance desired by a device 24.

Device 24 for one embodiment is an FET device characterized by having three terminals 25, 26 and 27. Terminals 25 and 26 (drain and source respectively of an FET) define therebetween the principle current conduction path of the active device. The potential applied between terminal 27 (gate of an FET) and terminal 26 controls the conduction in the principle current conduction path. If the device under test 24 is a bipolar transistor, terminals 25, 26 and 27 are the collector, emitter and base thereof respectively.

Figure 2:
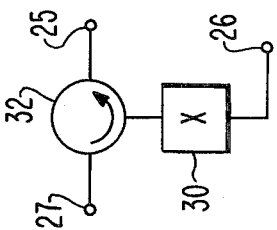
FIG. 2 is a schematic diagram of a two terminal negative resistance active element and a circulator suitable for use as an active device in FIG. 1.

Referring to FIG. 2, there is illustrated how a two terminal negative resistance device 30 is connected between terminals 25, 26 and 27. The negative resistance device is used with a three port circulator 32. The device 30 is connected at one end to terminal 26 and at the other end to one port of circulator 32. The other ports of circulator 32 are connected to terminal 27 and terminal 25 respectively. The device 24 in FIG. 1 could be the negative resistance device 30 in combination with circulator 32 as illustrated in FIG. 2 where device 30 may be an impatt diode, a trapatt diode, a tunnel diode or a transferred electron device (Gunn effect) by way of example. For purposes of the claims the term "active device" includes both a three terminal device and a two terminal device with circulator. The device 24 has applied to it DC bias potentials from sources denoted $V_{Bias\,1}$ and $V_{Bias\,2}$ respectively. The particular nature of the biases and the way the biases are coupled to the device 24 will depend on the particular device and will be applied in a manner well known to those skilled in the state of the art of the device being tested. It will be understood that certain alternating signal (AC) blocking elements (28 and 29) will be placed between the two bias sources $V_{Bias\ 1}$ and $V_{Bias\ 2}$ and terminals 27 and 25 respectively and that DC blocking elements (31 and 32) will be placed between the bias sources and the input and output terminals 27 and 25 respectively of the device as dictated by the particular device under test. It will be further understood that a two terminal device typically requires only one bias supply $V_{Bias\ 1}$ which may be applied as shown using for example a microstrip circulator with the narrow conductor coupling the DC. The output terminals 25 and 26 of device 24 are connected to an adjustable impedance means 40. Adjustable impedance means 40 is arranged to be adjustable over a wide range of values consistent with the frequencies at which the test setup of FIG. 1 operates. For an FET device used at microwave frequencies, impedance means 24 may ideally be of the type described by Joseph M. Cusack, et al., in a paper entitled "Automatic Load Contour Mapping for Microwave Power Transistors," IEEE Transactions on Microwave Theory and Techniques, Vol. MTT-22, No. 12, December, 1974, pp. 1146–1152.

Impedance means 40 may be manually adjusted. However, the type of measurement about to be described would be rather lengthy with such a manually adjustable impedance. A power meter 42 may be coupled via a directional coupler 41 to impedance means 40 to measure the power supplied by device 24 to impedance means 40, i.e., the output power of device 24 in a test setup involving some form of automation, a power meter in turn may be connected to a computer 44 an output of which is connected to control the impedance values of adjustable impedance 40. A spectrum analyzer is coupled via coupler 41 to impedance means 40 to provide amplitude vs. frequency display or reading for which one can determine, in a manner to be described, the linearity of the signal applied to impedance 40 by device 24. As utilized by the inventors, spectrum analyzer 46 was of the type which displays on a CRT all frequencies of interest produced by device 24. In particular, the frequencies displayed by analyzer 46 include the frequencies produced by generators 12 and 14 which appear at an amplitude C. Except in the case of an absolutely linear device 24, which is in practice unachievable, the displayed frequencies include at least one other frequency which is termed an intermodulation distortion product. The greatest intermodulation distortion product frequency appearing on analyzer 46 has an amplitude I. The ratio C/I is a measure of amplifier linearity. If generator 12 produces frequency $F_1$ and generator 14 produces frequency $F_2$ then the third order intermodulation distortion frequencies will be $2 F_1 - F_2$ and $2 F_2 - F_1$. Spectrum analyzers 46 are available which can digitize the frequencies determined thereby to exist at impedance 40 and to transmit this information to computer 44 for purposes to be described hereinafter.

Computer 44 is also coupled to an output recording device 48. In a completely computer controlled test setup, output device 48 may simply be a printer for providing a final listing of an optimum impedance value, a value of input power to be applied to circuit 24 and a value of output power for the optimum impedance value of impedance 40. In a semiautomatic test setup, the output recorder 48 may be a plotter. The input power to device 24 is measured by a power meter 50 coupled via a directional coupler 51 in a suitable manner to the input signal path of device 24. In a completely computerized setup, power meter 50 would be coupled to computer 44 as one input thereof. In a graphic presentation power meter 50 would simply be read as appropriate.

Figure 3:
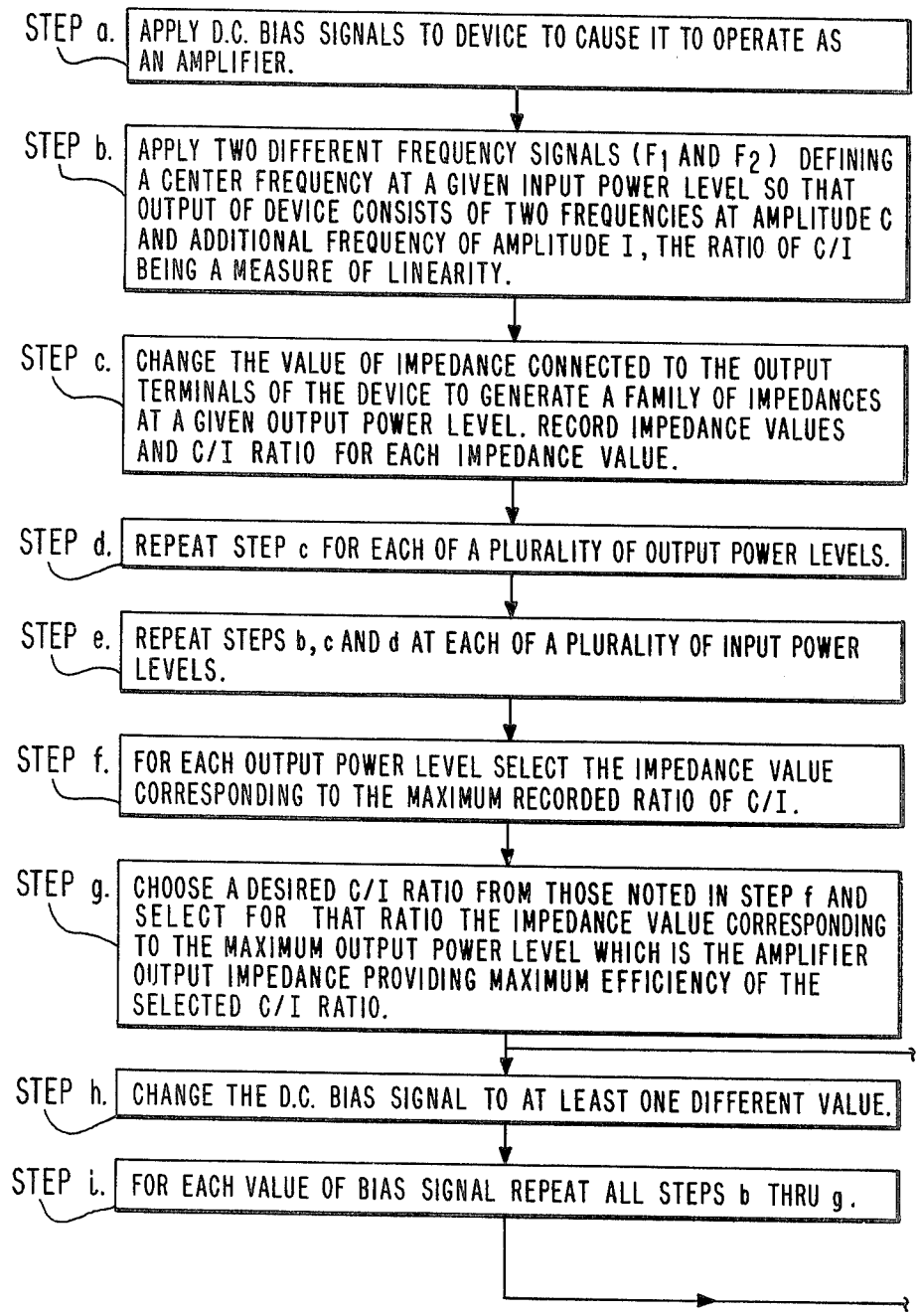
FIG. 3 is a set of steps in block diagram form illustrating the method of practicing the invention.
Figure 3:
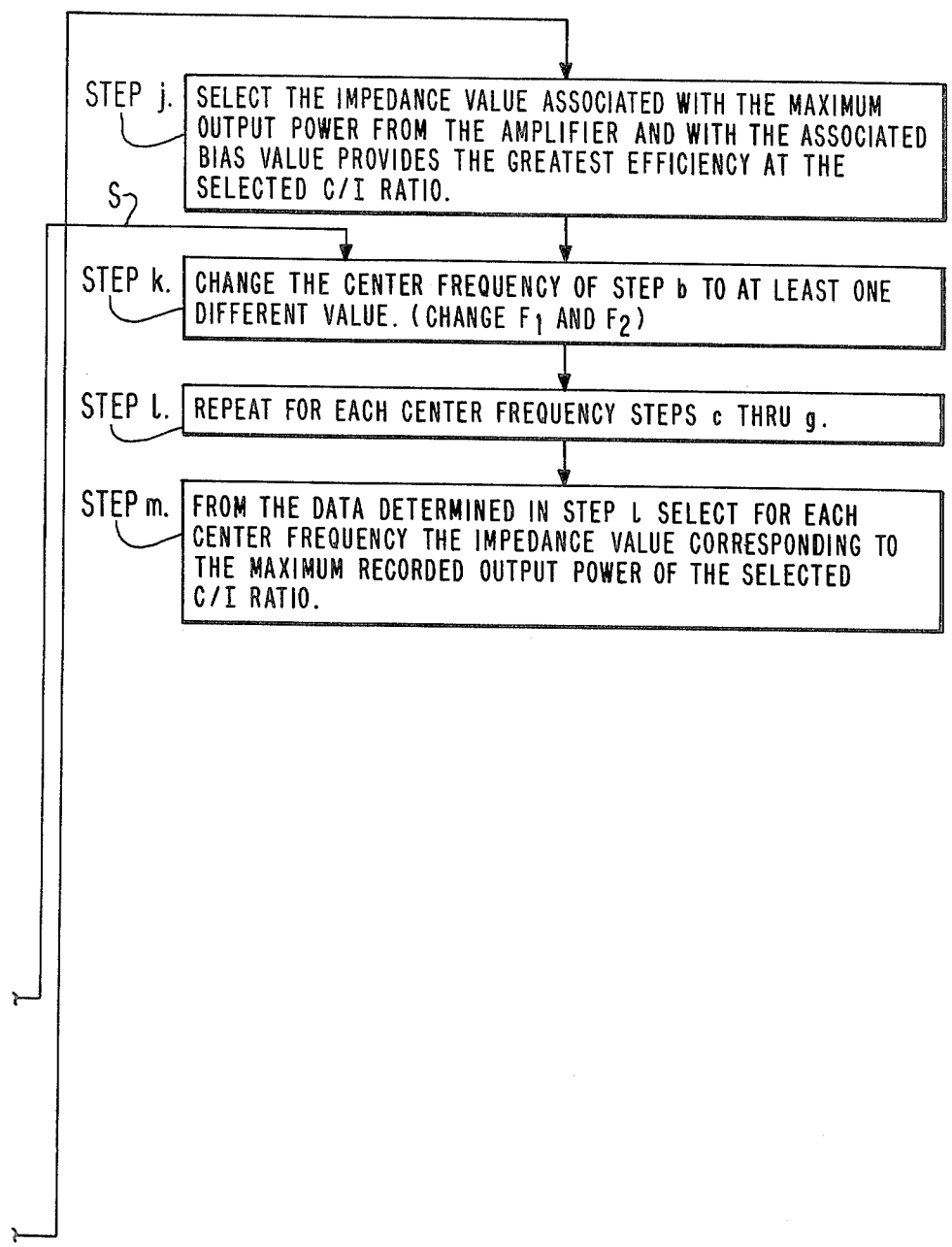

Utilizing the test setup of FIG. 1, the determination of the impedance value and input power level which will provide a given value of linearity by the device 24 and the greatest possible efficiency or output power (all at a given input frequency of given range of input frequencies) is achieved by utilizing the following method as illustrated in FIG. 3 which should be referred to as appropriate. In the method to follow a GaAs FET type amplifier will be described in detail.

In first step (a), appropriate bias voltages of $V_{Bias\ 1}$ and $V_{Bias\ 2}$ (when a three terminal device is used) are applied to device 24 to provide amplification. With a two terminal device only $V_{Bias\ 1}$ is chosen by conventional techniques consistent with the type of device under test and may be later modified to improve the amplification efficiency. See FIG. 3, step (a).

In second step (b), generators 12 and 14 are set to frequencies at which device 24 is to be operated as an amplifier and are set to frequencies which differ only slightly from one another and which difference is substantially smaller than the bandwidth of device 24. For the example, the FET amplifier designed to operate between 3700 MHz and 4200 MHz and with a difference of 6 MHz, $F_1$ may be set to $(4200+3700+6) \div 2 = 3953$ MHz and $F_2$ is set to 6 MHz lower or 3947 MHz. The average of the two frequencies $F_1$ and $F_2$ is called the center or average frequency which in this example is also the midpoint of the amplifier operating range. Both frequencies $F_1$ and $F_2$ are set such that signals of equal amplitudes C appear on the analyzer 46. See FIG. 3, step (b).

In step (c) the impedance means 40 is set to an impedance value which provides some given output power level. As an example, impedance means 40 may be set to a value which causes device 24 to produce its maximum output power (considering the input power and bias voltages applied to device 24). Then the input power level determined by power meter 50, impedance value of impedance means 40, output power level determined by power meter 42 and C/I ratio determined by spectrum analyzer 46 are recorded. The recordation method will depend on the level of automation employed. As abovementioned, three different systems will be described. The first system, a manual system, assumes a minimum of unusual test equipment. The second semiautomatic system involves the use of a computer driven impedance means 40 such as that described in the aforementioned article by Cusack et al., but assumes a spectrum analyzer which only on a cathode ray tube displays the spectrum of frequencies determined by it. The third fully automatic system assumes a sophisticated computer program that controls the operation automatically of impedance means 40 and receives inputs from power meters 50 and 42 and automatically computes C/I ratios from spectrum analyzer 46.

Figure 4:
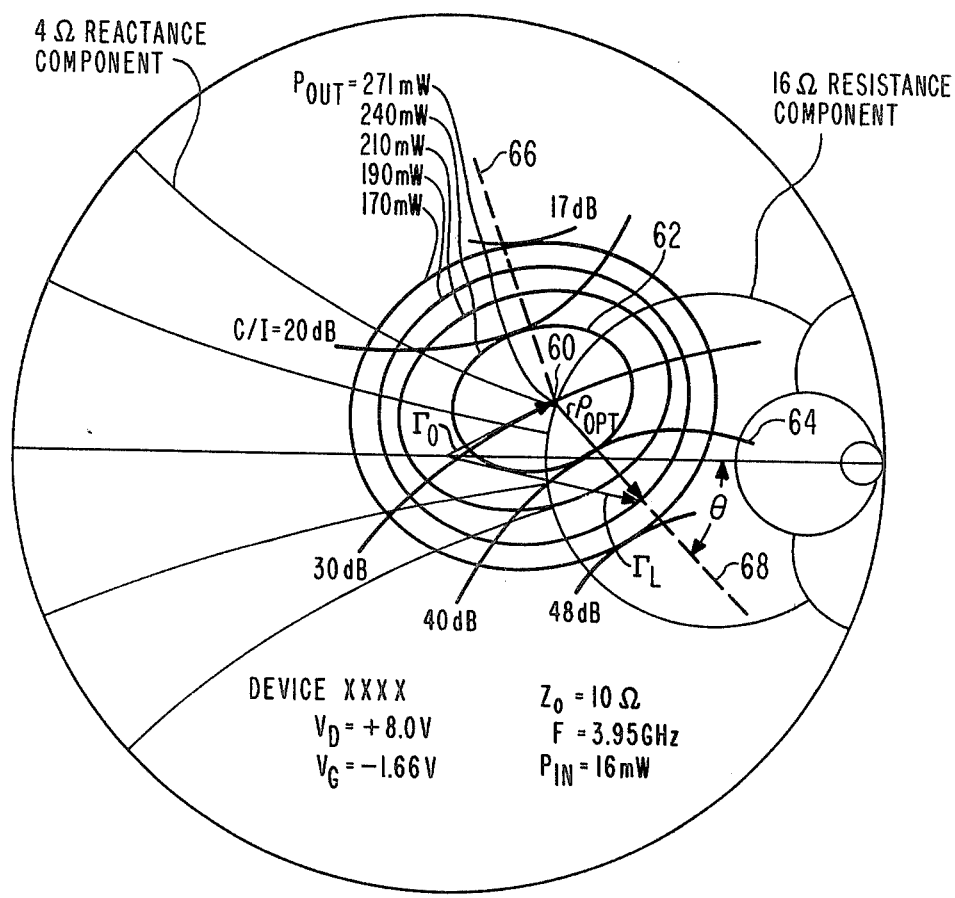
FIG. 4 is a graphic representation of values obtained with the test setup of FIG. 1.

In a completely manual system the recordation may be in tables on an appropriate form. In a semiautomatic setup the information may be recorded on a Smith chart. See such a Smith chart in FIG. 4 upon which is indicated an input power $P_{IN}$ of 16 milliwatts, a center frequency F of 3.95 GHz, a maximum output power $P_{OUT}$ of 271 milliwatts for a selected FET device XXXX with a +8.0 volt drain voltage ($V_{Bias\ 2}$) and a −1.66 volt gate voltage ($V_{Bias\ 1}$). An impedance is illustrated at point 60 of 16 ohms resistance component and of 4 ohms reactance component. Note that the various curves illustrated in the Smith chart of FIG. 4 are substantially fewer in number than those which would appear on a standard Smith chart.

Computer 44 may be arranged to illustrate the impedance value directly on a Smith chart by a chart recorder which is output recorder 48. Finally, in a fully automatic design system computer 44 may store the input power level, output power level, C/I ratio and impedance value in memory for later use. See FIG. 3, step (c).

In step (d) a new output power level is selected such as one which is 0.5 dB lower than the maximum power level previously selected. Impedance means 40 is adjusted to a value which causes the selected output power level to be achieved as indicated on power meter 42. Unlike the situation with the maximum power, a family of impedances will cause the FET to deliver the said output power 0.5 dB below the maximum output power generated. In accordance with the aforementioned article by Cusack et al., computer 44, in conjunction with impedance means 40 and power meter 42, may cause a number of such impedances to be generated.

In a manual system impedance 40 is adjusted by an operator and the input power, output power, frequency, selected impedance values in associated C/I ratios are tabulated. In the fully automatic system the tabulation occurs within computer 44. In the semiautomatic system computer 44 causes the impedances to be recorded by recorder 48 on the Smith chart FIG. 4 as contour 62. It will be noted that the contour actually drawn on the Smith chart proceeds in a zig-zag fashion first on one side of the idealized contour illustrated as contour 62 and then on the other side as computer 44 "hunts" for the proper set of impedances.

As the contour 62 is being drawn, which with the aforementioned Cusack et al., system requires several minutes, C/I ratios as read from spectrum analyzer 46 are illustrated as points on the Smith chart at appropriate impedance locations with C/I ratios noted. The individual points are not shown in FIG. 4 as points of the same C/I ratio will later be connected together. See FIG. 3, step (d).

The process above described is repeated at several other output power levels which is below the maximum output power level corresponding to the given input power level. See FIG. 3, step (d).

The process (step (e) in FIG. 3) is then repeated for other input power levels in, for example, 0.5 dB steps until some maximum or minimum input power level of interest is reached. With the semiautomatic system different Smith charts similar to that illustrated in FIG. 4 are used for each input power. See FIG. 3, step (e).

For an amplifier operating at a single center or average frequency at which the device was tested and operated with given bias values as tested, the testing of the actual device is complete. Then the determination of optimum impedance value and input power value proceeds as follows.

In step (f) of FIG. 3, the maximum C/I ratio is selected and the value of the impedance associated with that C/I level is recorded for each output power level selected. In the manual and fully automatic systems the determination is accomplished by looking at the tables by manual and automatic means respectively. Since only a finite numer of C/I ratios and impedances are recorded, interpolation may be necessary to determine the maximum C/I ratio and impedance value. In the semiautomatic system points of equal C/I ratios are connected by hand to form a plurality of open contours at preselected C/I ratios. Contour 64 in FIG. 4, for example, is the contour of all points at 40 dB. It will be noted from an inspection of FIG. 4 that for a given C/I ratio the best load impedance is the one "closest" to the center of the power contour or closest to impedance 60 associated with the maximum power, since the impedance would provide the maximum output power for a given value of ratio C/I. This corresponds to the general situation of selecting for each output power the maximum C/I ratio and associated impedance value. The relationship between the C/I ratios and the power contours can be defined more precisely by stating that the optimum load impedance is defined by the tangent point between the maximum C/I ratio contour and the corresponding power contours.

For a normal device only one power contour is tangent to one maximum C/I contour; thus the tangent point is unique. The optimum power path is defined as the locus of tangent points between the power and the C/I contours. This path being a gradient of both power and C/I contours is therefore that unique line perpendicular at any point to both contours. This path is approximated for convenience by two straight lines 66 and 68 as illustrated in FIG. 4. The two lines 66 and 68 may extend from point 60 in FIG. 4. Lines 66 and 68 are also drawn on all other Smith charts for other input power levels.

The reflection coefficient, $\Gamma_L$, of any point along either of lines 66 or 68 can now be written as:

$$\Gamma_L = \Gamma_O + \rho \exp(j\theta) \qquad (1)$$

where, $\Gamma_O$ is the reflection coefficient of the intersection of lines 66 and 68;

$\rho$ is the distance of any point of the line from the intersection in units of length; and $\theta$ is the angular position of a line.

Figure 5:
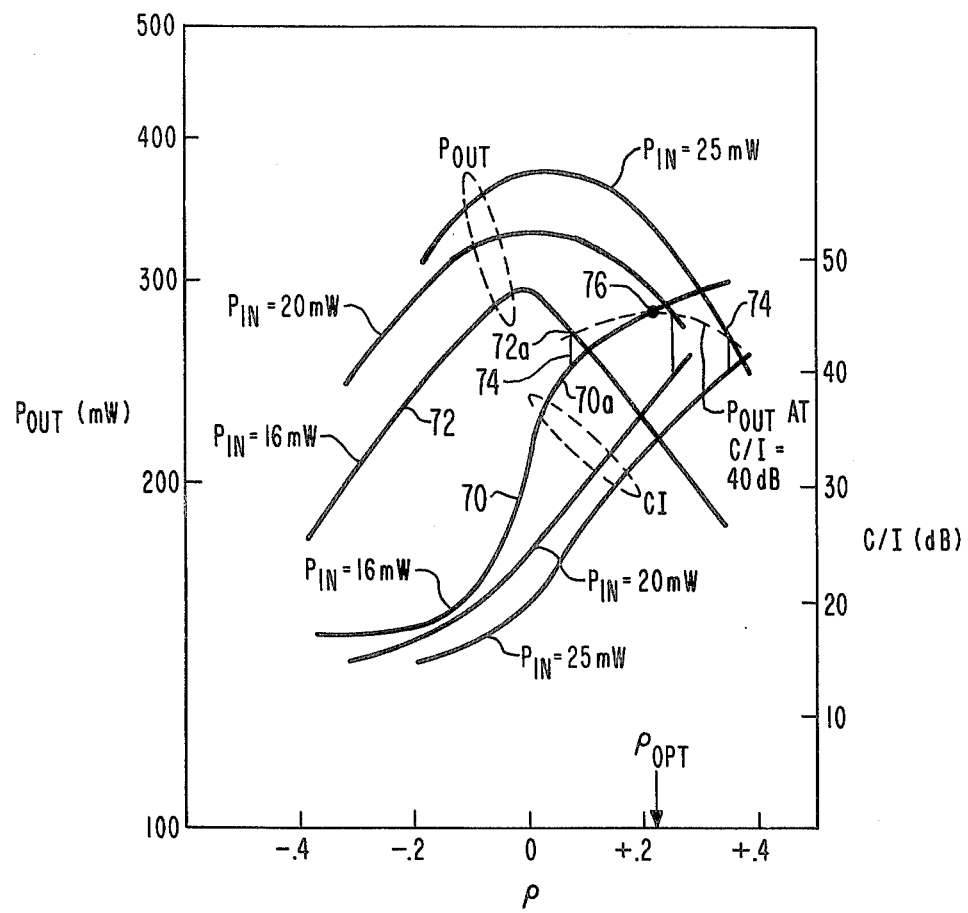
FIG. 5 is a plot of various data taken from the test setup of FIG. 1 for determining an optimum impedance and input power.

It will be noted from equation (1) above that the reflection coefficient of the load represented by the complex number $\Gamma_L$ is a function of only one independent real-variable $\rho$. Therefore, one can plot, as a function of $\rho$, the values of output power and C/I ratios read along the optimum path defined by lines 66 and 68, FIG. 4. This plot is shown in FIG. 5. From FIG. 4 a plot corresponding to an input power of 16 milliwatts of C/I ratio along the optimum path defined by lines 66 and 68 versus distance is plotted as illustrated by waveform 70. Similarly, for the 16 milliwatt input power the various output powers along lines 66 and 68 are plotted as a function of the distance along the line. It will be noted that positive distances of $\rho$ correspond to distances along line 68 while negative distances correspond to distances along line 66 each with reference to the origin point 60, as illustrated by curve 72. Utilizing other Smith charts similar to the chart of FIG. 4, output power curves and C/I curves are drawn for other input power levels. Two such levels 20 milliwatts and 25 milliwatts are illustrated in FIG. 5. This plot in FIG. 5 corresponds to step (f) of FIG. 3.

In step (g) (FIG. 3) a desired value of C/I from those recorded in the preceding step or illustrated in FIG. 5 is chosen. It will be noted from FIG. 5 that each of input power levels 16 milliwatts, 20 milliwatts and 25 milliwatts attains a C/I ratio of 40. Such information would be noted also by looking at the tables either tabulated in the manual system or in the fully automated system. The impedance value with associated input power level is selected from the tabulated information for the chosen C/I ratio which corresponds to the maximum output power level at, for an example 40 decibels. The impedance value thus selected is the value of load impedance which, when applied to the output terminals of device 24 and with the corresponding input level is applied to the input terminal 27 of device 24, produces the maximum efficiency for the desired C/I ratio, namely 40 decibels, at the given bias values and at the given center or average frequency. Utilizing the semi-automatic system and with reference to FIG. 5, having selected a desired C/I value such as 40 decibels, it is now possible to determine from FIG. 5 the output power as a function of $\rho$. This is accomplished by extending for each C/I curve a vertical line from the C/I=40 value up to the associated output power curve. Thus, for example, for curve 70 a line 74 extends from point 70a of curve 70 to point 72a of curve 72. In similar fashion, lines extend from curves for input powers of 20 milliwatts and 25 milliwatts to the associated output power curves. Thus, by connecting a line between the points on the output power curves such as illustrated by dotted line 74 an output power curve corresponding to a C/I ratio of 40 decibels may be determined. As illustrated, the output power curve 74 peaks at a $\rho$ of $+0.25$. This is the optimum operating point corresponding to a C/I ratio of 40 dB. From FIG. 4, this point corresponds to an input power of 20 milliwatts and an output power of 280 milliwatts. The corresponding output load impedance can also be determined from FIG. 4 to be $24+j4$ ohms.

In step (h) (FIG. 3) the DC bias signal is selected to a different value. For the example of the FET amplifier 0.2 volts above and below the original DC bias level.

In step (i) (FIG. 3), for each of the new DC bias levels repeat all of the steps (b) through (g). In step (j) (FIG. 3), select the impedance value associated with maximum output power from the amplifier and with the associated bias value provides the greatest efficiency at the selected C/I ratio.

In step (k) (FIG. 3), the center or average frequency is changed by changing the $F_1$ and $F_2$ frequencies in step (b) (FIG. 3) to a different value. For the FET example the frequencies $F_1$ and $F_2$ are changed together in 100 MHz frequency steps within the frequency band of interest (amplifier passband). In step (l) the steps (c) through (g) (FIG. 3) are repeated for each center or average frequency. In step (m) (FIG. 3) select for each center or average frequency the impedance value corresponding to the maximum recorded output power for the desired C/I ratio. In some cases the DC bias level may not need to be changed for the desired performance required and one may skip from step (g) to step (k) as illustrated by lead S in FIG. 3. Also one may find it sufficient for the desired performance to stop after step (g).

We claim:

1. In a linear amplifier including an active device and an output load impedance, said active device having first and second electrodes between which is connected said load impedance, said first and second electrodes defining therebetween the principle current conduction path of said active device, said active device having a third electrode, the potential between its first and third electrodes controlling the conduction in its principle current conduction path, the method of determining the value of total output impedance between said first and second terminals and for determining the value of input power to be applied between said first and third terminals such that said device produces a desired linearity and operates at no less than a given efficiency directly related to output power for a given DC bias, comprising the steps of:
   a. applying DC bias to said active device for causing said active device to operate in its amplification mode;
   b. applying between said first and third terminals two different frequency signals the average defining a center frequency within the bandwidth of said amplifier at a given input power level, the difference between said frequencies being small in comparison to the bandwidth of said amplifier, said device thereby producing between said first and second terminals a signal comprised of said two different frequencies at amplitude C and at least one other frequency of amplitude I, which other frequency is an intermodulation distortion product frequency where the ratio C/I is a measure of amplifier linearity and where a larger ratio corresponds to a better linearity than does a lower ratio;
   c. changing the value of said impedance connected between said first and second terminals to produce a family of impedance values which causes said amplifier to have a preselected output power at said first and second terminals and recording each impedance value, and associated C/I ratio for each impedance value, there being a maximum C/I ratio;
   d. repeating step (c) for each of a plurality of output power levels;
   e. repeating steps (b), (c) and (d) at a plurality of different input power levels;
   f. from recorded information in step (e), for each output power level, selecting the impedance value corresponding to said maximum ratio of C/I and recording the impedance values and corresponding C/I ratios, input power levels and output power levels;
   g. choosing a desired C/I ratio from those recorded in step (f) and selecting, from information recorded in step (f) for the chosen C/I ratio, the impedance value corresponding to the maximum output power level, said selected impedance value being the value of said load impedance which, when said corresponding input power level is applied between said first and third terminals, produces the maximum efficiency for the desired C/I ratio at the given bias values and at the given center frequency.

2. The method as set forth in claim 1 further comprising the steps of:
   h. changing the value of said DC bias in step (a) to at least one different given value;
   i. for each given value of said DC bias repeating all steps (b) through (g);
   j. from the data determined in step (i) selecting the impedance value, the value of the DC bias and the input power level corresponding to the maximum recorded output power, said selected impedance value being the value of said load impedance for said selected input power level and said selected DC bias to produce said maximum efficiency at said selected C/I ratio.

3. The method as set forth in claim 2 further including the steps of:
  k. changing the frequency of said two different frequency signals of step (b) to at least one different value to produce a different average frequency within said amplifier bandwidth;
  l. repeating, for each average frequency, steps (c) through (g);
  m. from the data determined in step (l) selecting for each average frequency the impedance value corresponding to the maximum recorded output power at the selected C/I ratio.

4. The method as set forth in claim 1 further including the steps of:
  k. changing the frequency of said two different frequency signals of step (b) to at least one different value to produce a different average frequency within said amplifier bandwidth;
  l. repeating, for each average frequency, steps (c) through (g);
  m. from the data determined in step (l) selecting for each average frequency the impedance value corresponding to the maximum recorded output power at the selected C/I ratio.

* * * * *